(12) United States Patent
Fujita et al.

(10) Patent No.: US 7,949,251 B2
(45) Date of Patent: May 24, 2011

(54) CAMERA AND ELECTRONIC DEVICE

(75) Inventors: Masayuki Fujita, Yamato (JP); Riichi Higaki, Matsudo (JP)

(73) Assignee: Nikon Corporation, Tokyo (JP)

( * ) Notice: Subject to any disclaimer, the term of this patent is extended or adjusted under 35 U.S.C. 154(b) by 120 days.

(21) Appl. No.: 12/222,017

(22) Filed: Jul. 31, 2008

(65) Prior Publication Data

US 2009/0279883 A1 Nov. 12, 2009

(30) Foreign Application Priority Data

Aug. 2, 2007 (JP) ................................ 2007-201527

(51) Int. Cl.
*G03B 7/26* (2006.01)
(52) U.S. Cl. ........................................ 396/279; 396/544
(58) Field of Classification Search .................. 348/372; 396/277–279, 290, 291, 292
See application file for complete search history.

(56) References Cited

U.S. PATENT DOCUMENTS

| | | | | |
|---|---|---|---|---|
| 5,963,010 | A * | 10/1999 | Hayashi et al. | 320/106 |
| 6,101,339 | A * | 8/2000 | Miki et al. | 396/301 |
| 2004/0005497 | A1 * | 1/2004 | Nunomaki et al. | 429/92 |
| 2005/0280397 | A1 * | 12/2005 | Iwamoto | 320/132 |
| 2007/0188145 | A1 * | 8/2007 | Kim et al. | 320/132 |
| 2008/0174264 | A1 * | 7/2008 | Nomoto | 320/106 |
| 2008/0315840 | A1 * | 12/2008 | Mori et al. | 320/136 |

FOREIGN PATENT DOCUMENTS

| | | |
|---|---|---|
| JP | A-2003-46837 | 2/2003 |
| JP | A-2008-170169 | 7/2008 |

OTHER PUBLICATIONS

Smart Battery Data Specification Rev 1.1 (Dec. 1998), retrieved from the Smart Battery System Implementers Forum <http://www.sbs-forum.org/specs/> on Mar. 30, 2010.*

* cited by examiner

*Primary Examiner* — Clayton E Laballe
*Assistant Examiner* — Leon W Rhodes
(74) *Attorney, Agent, or Firm* — Oliff & Berridge, PLC

(57) ABSTRACT

A camera includes: an electrical-power-supply-source detection unit that detects, among a plurality of batteries, from which battery supply of electrical power is being received; a battery capacity detection unit that detects a remaining amount in each of the plurality of batteries; and a display control unit that displays, upon a display device, a result of detection by the electrical-power-supply-source detection unit and a result of detection by the battery capacity detection unit.

10 Claims, 4 Drawing Sheets

CAMERA (80%)

B. P. (33%)

CAMERA

B. P.

CAMERA

B. P.

CAMERA AND ELECTRONIC DEVICE

INCORPORATION BY REFERENCE

The disclosure of the following priority application is herein incorporated by reference: Japanese Patent Application No. 2007-201527 filed Aug. 2, 2007.

BACKGROUND OF THE INVENTION

1. Field of the Invention

The present invention relates to a camera for performing photography, and to an electronic device.

2. Description of Related Art

The electronic camera disclosed in Japanese Laid-Open Patent Publication No. 2003-46837 is known. With this electronic camera, when detecting the amount remaining in the battery during use and displaying this battery remaining amount upon a monitor, the relationship between the battery remaining amount and the battery voltage value is separated according to the classification of the battery by using a table that is prescribed in advance, and is reflected in the displayed result.

SUMMARY OF THE INVENTION

With this prior art electronic camera, since it is only arranged to detect and to display the amount remaining in the battery that is being used, accordingly, if it is possible to mount a plurality of batteries to the camera, it has not been possible to display the amounts remaining in the battery or batteries that are not being used, along with displaying the amount remaining in the battery that is being used.

According to the 1st aspect of the present invention, a camera comprises: an electrical-power-supply-source detection unit that detects, among a plurality of batteries, from which battery supply of electrical power is being received; a battery capacity detection unit that detects a remaining amount in each of the plurality of batteries; and a display control unit that displays, upon a display device, a result of detection by the electrical-power-supply-source detection unit and a result of detection by the battery capacity detection unit.

According to the 2nd aspect of the present invention, a camera according to the 1st aspect, it is preferred that the display control unit displays, upon the display device, remaining amounts for all of the plurality of batteries that have been detected by the battery capacity detection unit.

According to the 3rd aspect of the present invention, a camera according to the 1st aspect, it is preferred that the display control unit displays the remaining amount in each of the plurality of batteries using at least one of drawings and numerical values.

According to the 4th aspect of the present invention, a camera according to the 2nd aspect, it is preferred that the battery capacity detection unit further detects total capacity of each of the plurality of batteries; and if battery remaining amount is being shown by drawings, the display control unit displays a plurality of regions corresponding respectively to the plurality of batteries, and, with entire range of one region being taken as being total capacity of one battery that corresponds to that region, shows a proportion of the battery remaining amount of that battery with respect to its total capacity by adding color to a range that corresponds to the battery remaining amount within that region.

According to the 5th aspect of the present invention, a camera according to the 3rd aspect, it is preferred that the display control unit performs display so that an area of each region that corresponds to one of the plurality of batteries becomes an area that is proportional to total capacity of that one of the plurality of batteries.

According to the 6th aspect of the present invention, a camera according to the 3rd aspect, it is preferred that the display control unit shows from which one of the plurality of batteries, among the plurality of batteries, supply of electrical power is being received by changing display format of at least one of a region that corresponds to a battery from which electrical power is being supplied, and a numerical value that specifies a remaining amount of the battery from which electrical power is being supplied.

According to the 7th aspect of the present invention, a camera according to the 5th aspect, it is preferred that the display control unit makes a contrast between a color applied within a region that corresponds to a battery from which electrical power is not being supplied and a color outside that region, lower than a contrast between a color applied within a region that corresponds to a battery from which electrical power is being supplied and a color outside that region.

According to the 8th aspect of the present invention, a camera according to the 5th aspect, it is preferred that the display control unit displays a region that corresponds to the battery from which electrical power is being supplied as blinking.

According to the 9th aspect of the present invention, a camera according to the 5th aspect, it is preferred that the display control unit displays a region that corresponds to a battery from which electrical power is being supplied along with a numerical value that specifies a remaining amount of the battery from which electrical power is being supplied, and displays a region that corresponds to a battery from which electrical power is not being supplied by itself.

According to the 10th aspect of the present invention, a camera according to the 1st aspect, it is preferred that the camera further comprises a battery type detection unit that detects a type of each of the plurality of batteries. The display control unit changes a display format for a result of detection by the battery capacity detection unit, based upon a result of detection by the battery type detection unit.

According to the 11th aspect of the present invention, an electronic device comprises: an electrical-power-supply-source detection unit that detects, among a plurality of batteries, from which battery supply of electrical power is being received; a battery capacity detection unit that detects a remaining amount in each of the plurality of batteries; and a display control unit that displays, upon a display device, a result of detection by the electrical-power-supply-source detection unit and a result of detection by the battery capacity detection unit.

DESCRIPTION OF THE PREFERRED EMBODIMENTS

Figure 1:
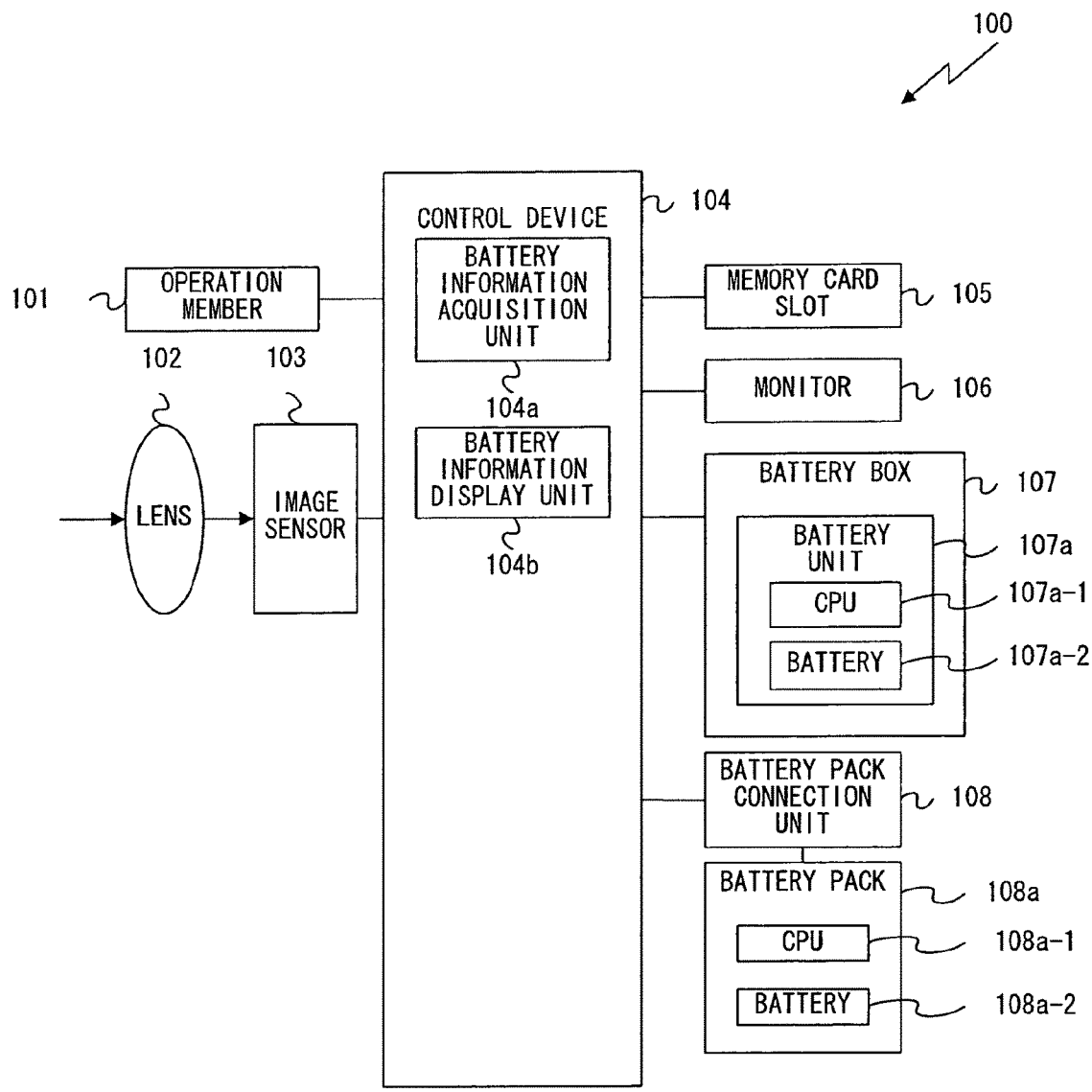
FIG. 1 is a block diagram showing the structure of a camera according to an embodiment of the present invention.

FIG. 1 is a block diagram showing the structure of a camera according to an embodiment of the present invention. This camera 100 is, for example, a digital camera, and includes operation members 101, a lens 102, an image sensor 103, a control device 104, a memory card slot 105, a monitor 106, a battery box 107, and a battery pack connection unit 108. The operation members 101 include various members that are actuated by the user, for example a power supply button, a release switch, a zoom button, a 4-way directional pad button, a confirm button, a replay button, a delete button, and the like.

The lens 102 consists of a plurality of optical lenses, but only one lens is shown in FIG. 1 as a representative. The image sensor 103 is, for example, a CCD or a CMOS, and captures an image of a photographic subject that is imaged by the lens 102, thus acquiring image data, and then outputs this acquired image data to the control device 104. With the image data that has been acquired, the control device 104 creates an image file of a predetermined image format such as EXIF (Exchangeable Image File Format for Digital Still Cameras) based upon, for example, JPEG compression, and outputs this file to the memory card slot 105.

The memory card slot 105 is a slot for insertion of a memory card, that acts as a storage medium, and the image file outputted from the control device 104 is written upon this memory card. And, based upon a command from the control device 104, the memory card slot 105 also reads out an image file that is stored upon the memory card.

The monitor 106 is a liquid crystal monitor that is mounted upon the rear surface of the camera 100, and various sorts of information is displayed upon this monitor 106, such as images that are recorded upon the memory card (i.e. images for replay), and setting menus for setting the camera 100 and so on. The control device 104 acquires image data in time series from the image sensor 103 and outputs this data to the monitor 106. By doing this, the images of various frames are displayed upon the monitor 106 in order at predetermined time intervals. In other words, a live view is displayed upon the monitor 106.

A battery unit 107a for driving the camera 100 is inserted into the battery box 107. This battery unit 107a includes a CPU 107a-1 and a battery 107a-2. The CPU 107a-1 detects the total capacity of the battery 107a-2 and the amount remaining therein, and outputs information relating to both of these to the control device 104. In this embodiment, the total capacity of the battery 107a-2 is termed the total capacity of the battery unit 107a, and the remaining amount of the battery 107a-2 is termed the remaining amount of the battery unit 107a. In the information related to the remaining amount of the battery unit 107a, there is shown the proportion (%) of the remaining amount with respect to the total capacity of the battery 107a-2.

The battery pack connection unit 108 is an interface unit for connecting a battery pack 108a, that is an externally attached power supply. For example, this battery pack 108a may be made so as to be mounted upon and connected to the lower portion of the camera 100. The battery pack 108a also includes a CPU 108a-1 and a battery 108a-2, and the CPU 108a-1 detects the total capacity and the remaining amount of the battery 108a-2 and outputs information relating to both of these to the control device 104.

In this embodiment, the total capacity of the battery 108a-2 is termed the total capacity of the battery pack 108a, and the remaining amount of the battery 108a-2 is termed the remaining amount of the battery pack 108a. In the information related to the remaining amount of the battery pack 108a, there is shown the proportion (%) of the remaining amount with respect to the total capacity of the battery 108a-2.

For the batteries 107a-2 and 108a-2, for example, secondary batteries such as lithium ion batteries may be used. Here, the total capacity of each of these batteries 107a-2 or 108a-2 is the capacity that is obtained by subtracting, from its capacity when fully charged, its capacity when the operation of the camera 100 becomes impossible, or when that operation stops. In other words, the capacity within the battery capacity that the camera 100 can utilize is the total capacity of the battery in relation to the camera 100.

Accordingly, with the camera 100 of this embodiment, even if the battery remaining amount of the battery 107a-2 or 108a-2 is detected as being 0(%), this means that the required capacity for causing the camera 100 to operate has become exhausted, and does not mean that the battery capacity that remains in the battery 107a-2 or 108a-2 has become exactly zero.

The camera 100 is driven by receiving supply of electrical power from either one of the battery unit 107a that has been inserted into the battery box 107, or the battery pack 108a that has been connected to the battery pack connection unit 108. If no battery pack 108a is connected to the battery pack connection unit 108, while a battery unit 107a is inserted into the battery box 107, then the camera 100 is driven by receiving electrical power from the battery unit 107a. On the other hand, if no battery unit 107a is inserted into the battery box 107, while a battery pack 108a is connected to the battery pack connection unit 108, then the camera 100 is driven by receiving electrical power from the battery pack 108a.

When a battery unit 107a is inserted into the battery box 107, and moreover a battery pack 108a is connected to the battery pack connection unit 108, then the camera 100 is driven by receiving electrical power from either one of the battery unit 107a and the battery pack 108a. At this time, it would be acceptable for the user to designate from which of the battery unit 107a and the battery pack 108a supply of electrical power is to be received, or it would also be acceptable to arrange for the control device 104 automatically to select that one thereof whose battery remaining amount is the greater. In the following, in this embodiment, the explanation will be made in terms of the case of a battery unit 107a being inserted into the battery box 107, and also a battery pack 108a being connected to the battery pack connection unit 108.

The control device 104 includes a CPU, a memory, and other peripheral circuitry, and includes, as logical functional blocks, a battery information acquisition unit 104a and a battery information display unit 104b. The memory that is included in the control device 104 includes a ROM (for example, a flash memory) that stores an operating program and so on, and RAM (for example, SDRAM) that is used as a buffer memory.

The battery information acquisition unit 104a acquires information related to the total capacity of the battery unit 107a and information related to its battery remaining amount, outputted from the battery box 107, and also acquires information related to the total capacity of the battery pack 108a and information related to its battery remaining amount, outputted from the battery pack connection unit 108. In other words, the battery information acquisition unit 104a communicates with the battery unit 107a and the battery pack 108a, and acquires, as battery information, information related to the total capacity and the battery remaining amount of each of them.

The battery information display unit 104b makes visible the battery information for the battery unit 107a and the battery information for the battery pack 108a that has been acquired, and displays this information upon the monitor 106. Since, as described above, general information such as various types of menu, images for replay, and a live view or the like are displayed upon the liquid crystal monitor of the camera 100, i.e. upon the monitor 106, accordingly the battery information display unit 104b displays the battery information upon the monitor 106 as superimposed upon these other types of information. The battery information display unit 104b may display the battery information upon the monitor 106 at, for example, the upper right corner of the screen, so as not to impede the visibility of the information that is being displayed.

Figure 2A:
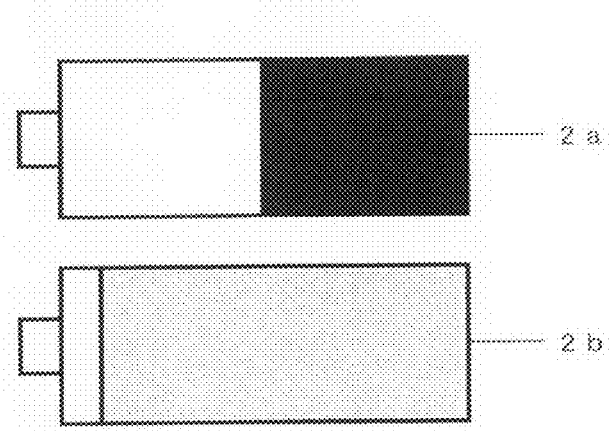
FIGS. 2A, 2B, and 2C are figures showing examples of display of information related to battery remaining amount upon a display device.
Figure 2B:
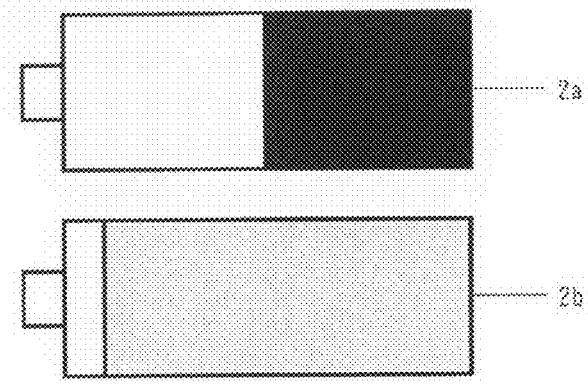
Figure 2C:
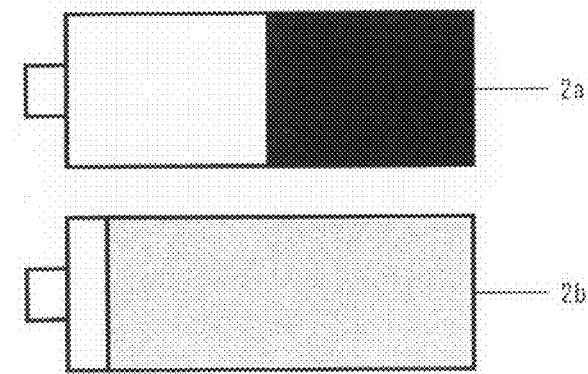

Each of FIGS. 2A, 2B, and 2C is a figure showing an example of display of battery information upon the monitor 106. "CAMERA" denotes the battery unit 107a, while "B.P." denotes the battery pack 108a. When displaying the battery information upon the monitor 106, as shown in FIGS. 2A, 2B, and 2C, the battery information display unit 104b may, for example, display a drawing 2a that shows the battery unit 107a schematically, and a drawing 2b that shows the battery pack 108b schematically, and may display the remaining amount for each of these batteries by displaying a bar graph internally to each of these drawings.

In other words, the battery information acquisition unit 104a displays regions upon the monitor 106 (the drawing 2a and the drawing 2b) that respectively correspond to each of the battery unit 107a and the battery pack 108b, and, if the entire range of each one of these regions is taken as being the total capacity of the battery that corresponds to that region, then the proportions of the remaining amounts of the batteries with respect to their total capacities are shown by coloring ranges within these regions that correspond to the battery remaining amounts.

Which one among the battery unit 107a and the battery pack 108b is in use, in other words from which one thereof the camera 100 is receiving supply of electrical power, is shown by changing the display format of the drawing 2a and the drawing 2b. For example, it may be made clear by changing the contrast between the color of the bar graph and the background color. In FIGS. 2A, 2B, and 2C, the bar graphs that show the remaining amount in the battery that is being used are displayed by color in which the contrast is made higher with respect to the background color. For example, they are displayed by black against a white background color. On the other hand, the bar graph that shows the remaining amount in the battery that is not being used is displayed by a color in which the contrast is made lower with respect to the background color, than in the bar graph that shows the remaining amount in the battery that is being used. For example, it may be displayed by gray against a white background color.

For example, in the example shown in FIG. 2A, the camera 100 shows that supply of electrical power is being received from the battery unit 107a by the corresponding bar graph being displayed at a contrast that is made higher with respect to the background color. In other words, it is being shown that the battery unit 107a is in use. The user is able to ascertain that the battery remaining amount in the battery unit 107a is around 50% and that the battery remaining amount in the battery pack 108b is around 90% from the lengths of the bar graphs, in other words sizes of the ranges, that are colored within the drawing 2a and the drawing 2b. In order to make it yet easier for the user to ascertain the battery remaining amounts, it would also be acceptable, as shown in FIG. 2B, along with showing the battery remaining amounts as bar graphs, to arrange for their numerical values also to be explicitly displayed in writing. Or, as shown in FIG. 2C, it would also be acceptable to arrange for only the numerical value for the battery that is being used, for example the battery unit 107a, to be displayed in writing.

If the total capacities of the battery unit 107a and the battery pack 108a are different, then, even though the remaining amounts for both of these batteries may be 50%, nevertheless the remaining amount is greater for that one of these batteries whose capacity is the larger. In this type of situation, as shown in FIG. 2A and FIG. 2B, by making the size of the drawing 2a that schematically shows the battery unit 107a, and the size of the drawing 2b that schematically shows the battery pack 108b, to be the same, and by only showing the battery remaining amounts by the lengths of the bar graphs displayed in their interiors, the user is not able to ascertain which battery capacity is the greater, and whose actual remaining amount is therefore the greater.

In this embodiment, the battery information display unit 104b changes the lengths in the horizontal direction of the drawing 2a and of the drawing 2b, based upon information related to the total capacity of the battery unit 107a and information related to the total capacity of the battery pack 108a that it has acquired. In other words, the battery information display unit 104b displays the drawing 2a and the drawing 2b so that the area of each of the regions that respectively correspond to the battery unit 107a and to the battery pack 108a (i.e. of the drawing 2a and the drawing 2b) becomes an area that is proportioned to the respective total capacity thereof. Due to this, the user is able to ascertain the difference in total capacity between the battery unit 107a and the battery pack 108a, and moreover is able to ascertain the relative battery remaining amounts of the battery unit 107a and the battery pack 108a.

Figure 3A:
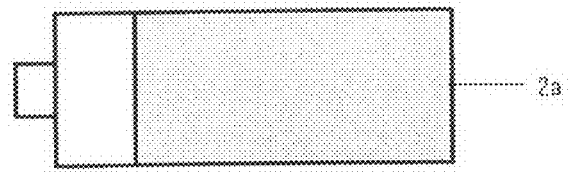
FIGS. 3A, 3B, and 3C are figures showing examples of display of relative information related to battery remaining amount upon the display device.
Figure 3A:
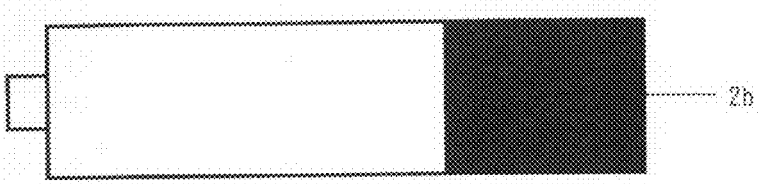

As shown in FIG. 3A, by, along with providing a relative display with the drawings of the battery remaining amounts, also displaying the respective remaining amounts in the batteries as percentages, it is possible for the user to relatively ascertain the difference in the remaining amounts of the two batteries, and it is also possible for him to confirm the numerical values of the remaining amounts in the batteries.

For example, if the total capacity of the battery pack 108a is 1.5 times the total capacity of the battery unit 107a, then the battery information display unit 104b may make the length in the horizontal direction of the drawing 2b be 1.5 times that of the drawing 2a. A bar graph is displayed in the interior of each of these drawings that corresponds to the respective battery remaining amount thereof. In the example shown in FIG. 3A, a case is shown in which the battery pack 108a is in use, the remaining amount in the battery unit 107a is 80%, and the remaining amount in the battery pack 108a is 33%.

Figure 3B:
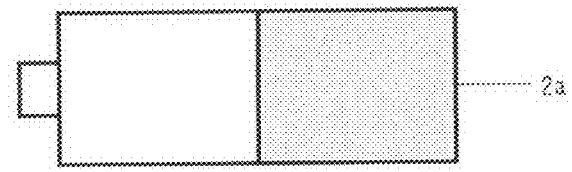
Figure 3B:
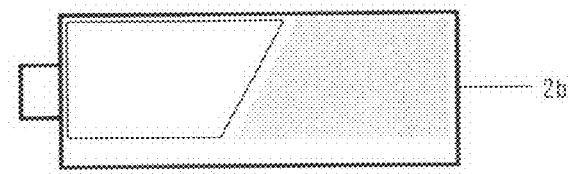

If the camera 100 can be connected to an AC adapter and driven by the supply of AC power, then, during such driving by the AC power supply, the camera 100 does not use either the battery unit 107a or the battery pack 108a. Due to this, in this type of case, as shown in FIG. 3B, the battery information display unit 104b displays both the bar graph within the drawing 2a and the bar graph within the drawing 2b with color whose contrast is made to be low with respect to the background color. And, if the battery remaining amount is insufficient, the background information display unit 104b changes the display format of the bar graph so as to invite the user to perform charging. The bar graph within the drawing 2b in FIG. 3B shows a display example for inviting the user to perform charging. It would also be acceptable to arrange to blink the bar graph in order to invite the user to perform charging.

Figure 4:
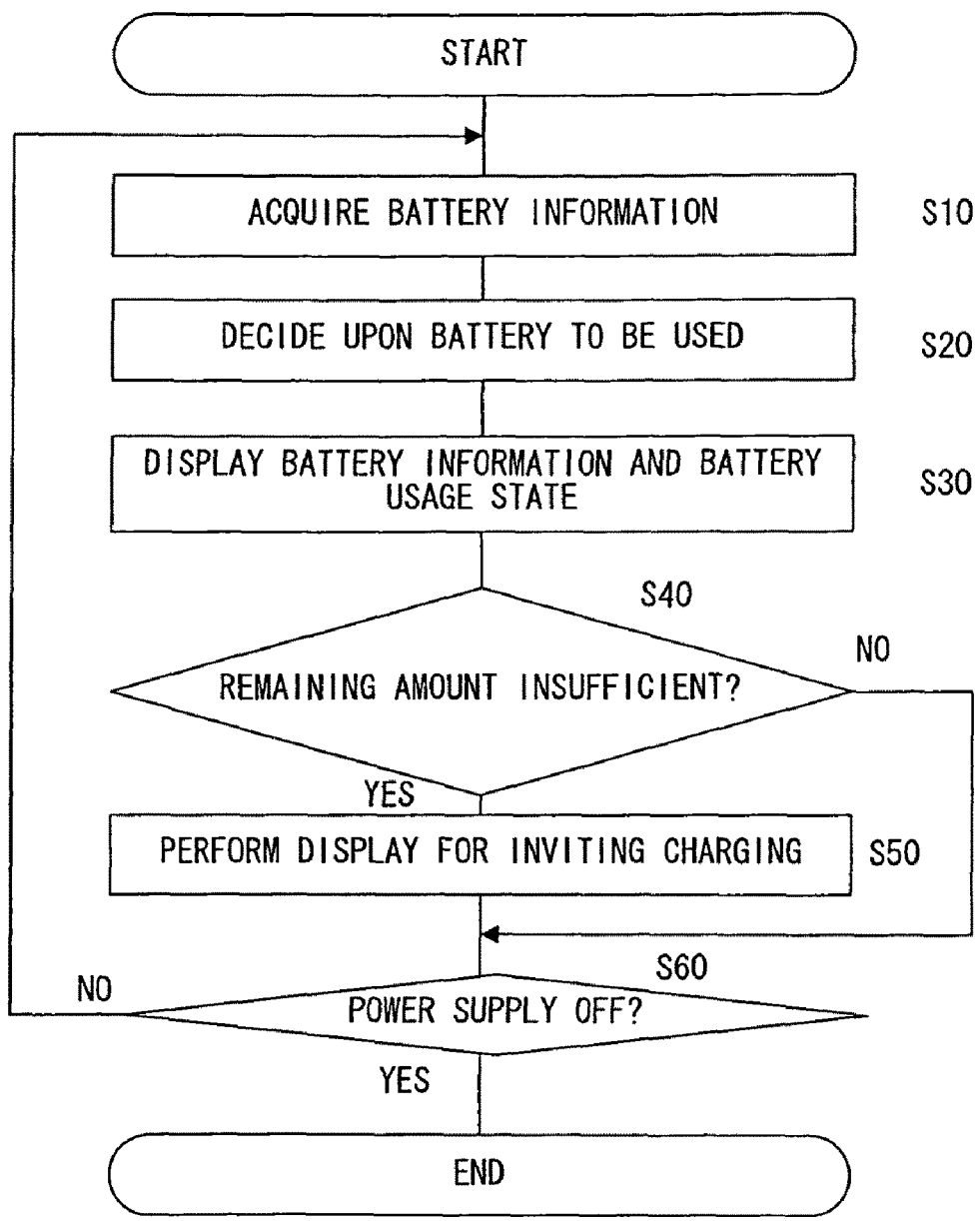
FIG. 4 is a flow chart showing processing performed by this camera.

FIG. 4 is a flow chart showing processing performed by the camera according to this embodiment. The processing shown in FIG. 4 is executed by the control device 104 according to a program that starts when the power supply to the camera 100 is turned ON.

In a step S10, the battery information acquisition unit 104a acquires information related to the total capacity of the battery unit 107*a* and information related to its battery remaining amount, outputted from the battery box 107, and acquires information related to the total capacity of the battery pack 108*a* and information related to its battery remaining amount, outputted from the battery pack connection unit 108. In other words, the battery information acquisition unit 104*a* acquires battery information. And, in a step S20, the battery information acquisition unit 104*a* decides from which of the battery unit 107*a* and the battery pack 108*a* the camera 100 should receive supply of electrical power and should be driven. In other words, for example, the battery information acquisition unit 104*a* makes the decision as to the battery to be in use by querying the control device 104.

In a step S30, the battery information display unit 104*b* displays the battery information and the battery usage state upon the monitor 106, as described above in FIGS. 2A, 2B, 2C, 3A, 3B, and 3C. And in a step S40, based upon the information relating to the remaining amounts of the batteries that has been acquired, the battery information acquisition unit 104*a* decides whether or not the battery remaining amount is insufficient. If an affirmative decision is reached, then in a step S50 the battery information display unit 104*b* changes the display format of the bar graph as shown in FIG. 3B so as to invite the user to perform charging, and then the flow of control is transferred to a step S60. By contrast, if a negative decision is reached, then the flow of control is transferred directly to the step S60.

In the step S60, a decision is made as to whether or not the power supply of the camera 100 has been turned OFF. If a negative decision is reached, then the flow of control returns to the step S10. Accordingly, while the power supply of the camera 100 is ON, the most recent state of the battery is always displayed upon the monitor 106. On the other hand, if an affirmative decision is reached in the step S60, then this processing terminates.

According to the embodiment explained above, the following beneficial operational effects may be obtained.

(1) The battery information acquisition unit 104*a* detects from which battery, among a plurality of batteries, supply of electrical power is being received, and detects the remaining amount in each of the plurality of batteries. And it is arranged for the battery information display unit 104*b* to display upon the monitor 106 the battery remaining amounts that the battery information acquisition unit 104*a* has detected. Due to this, if a plurality of batteries can be used, along with it being possible to display the remaining amount of the battery that is in use, it is also possible to display the remaining amount(s) in the battery/batteries that are not in use.

(2) It is arranged for the battery information display unit 104*b* to perform its display by using at least one of a drawing of the remaining amount in each of the plurality of batteries, and the numerical value thereof. Due to this, it is possible for the user visually to ascertain the remaining amount in each of the batteries from either the drawing display or the numerical value display.

(3) The battery information acquisition unit 104*a* also detects the total capacity of each of the battery unit 107*a* and the battery pack 108*b*. And, when the battery remaining amount is being shown by a drawing, the battery information display unit 104*b* displays regions upon the monitor 106 that correspond to each of the battery unit 107*a* and the battery pack 108*b*, and, when it is arranged for the entire range of a single region to shown the total capacity of the battery that corresponds to that region, then it is arranged to display a bar graph by coloring with added color the range within the region that corresponds to that battery remaining amount, thus displaying the remaining amount with respect to the total capacity of each battery. Due to this, the user is able visually to ascertain the remaining amount in each battery with respect to its total capacity.

(4) It is arranged for the battery information display unit 104*b* to display each region so that the areas of the regions that correspond to the battery unit 107*a* and the battery pack 108*b* become areas that are proportional to the total capacities of the battery unit 107*a* and the battery pack 108*b*, respectively. Due to this, even if the total capacity of the battery unit 107*a* and the total capacity of the battery pack 108*b* are different, the user is able to ascertain the difference in their total capacities, and is also able relatively to ascertain the remaining amounts in the battery unit 107*a* and the battery pack 108*a*.

(5) It is arranged for the battery information display unit 104*b* to show that the camera 100 is receiving supply of electrical power from one or the other of the battery unit 107*a* and the battery pack 108*b*, by changing the display format of the respectively corresponding one of the regions that correspond to the total capacity of the battery unit 107*a* and the battery pack 108*b*, and/or the numerical value that shows the battery remaining amount. Due to this, it is possible for the user visually to ascertain which battery is in use.

(6) For that battery from which the camera 100 is receiving supply of electrical power, the battery information display unit 104*b* displays a bar graph corresponding to that battery in a color whose contrast is higher than that of the background color. And, for that battery from which the camera 100 is not receiving supply of electrical power, it is arranged for the battery information display unit 104*b* to display a bar graph corresponding to that battery in a color whose contrast is lower with respect to the background color, than that of the bar graph that corresponds to the battery that is in use. Due to this, it is possible for the user visually to ascertain which battery is in use in a simple manner, according to the difference in the colors of the bar graphs with respect to the background color.

(7) For that battery from which the camera 100 is receiving supply of electrical power, it is arranged for the battery information display unit 104*b* to display a region that corresponds to that battery and a numerical value that shows its battery remaining amount, and, for a battery from which the camera 100 is not receiving supply of electrical power, it is arranged for the battery information display unit 104*b* to display only a region that corresponds to that battery. Due to this, it is possible for the user visually to ascertain which battery is in use in a simple manner, only by checking upon the presence or absence of the numerical value display.

Variant Embodiments

It should be understood that the camera according to the embodiment described above may also be varied in the following ways.

(1) In the embodiment described above, an example was explained in which the battery information acquisition unit 104*a* communicates with the battery unit 107*a* and the battery pack 108*a*, and thereby acquires their respective total capacities. However, it would also be acceptable to arrange for the battery information acquisition unit 104*a* to detect the respective total capacities, based upon the type of battery unit 107*a* that has been inserted into the battery box 107, and upon the type of battery pack that has been connected to the battery pack connection unit 108. In other words, in order to determine the total capacity of the battery unit 107*a* for each type of battery that is inserted into the battery box 107, these total capacities for each type of battery are recorded in advance in a memory. For example, a switch may be provided for detecting the type of battery within the battery box 107. In concrete terms, a plurality of switches may be provided so that the switch that is turned ON by the battery that is inserted varies, and the battery information acquisition unit 104*a* may detect which switch among these is ON and may thereby identify the type of the battery. And the battery information acquisition unit 104*a* may read from the memory the total battery capacity corresponding to this type of battery, thus detecting the total capacity of the battery unit 107*a*. And the battery information acquisition unit 104*a* may also detect the total capacity of the battery pack 108*a* in a similar manner.

(2) In the embodiment described above, an example was explained in which the one of the battery unit 107*a* and the battery pack 108*b* that was in use was made explicit by changing the contrast between the background color and the color of its bar graph. However, it would also be acceptable to make this explicit by some other method. For example, it would be acceptable to arrange to display the drawing that schematically represents the battery that is in use as accentuated by blinking or the like. By doing this, the user is able simply and easily to ascertain which of the batteries is being used, only from the display format of its drawing. It would also be acceptable to make it possible for the user to select what type of display format is to be employed.

Figure 3C:
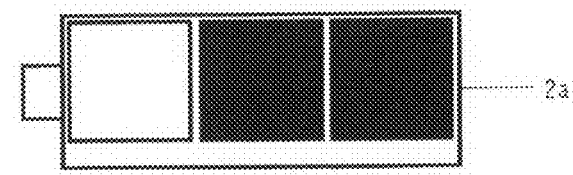
Figure 3C:
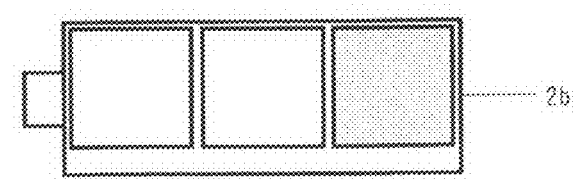

(3) In the embodiment described above, an example was explained in which the remaining amounts of the batteries were displayed by bar graphs. However, it would also be acceptable to arrange for the battery remaining amounts to be displayed in four stages, as shown in FIG. 3C. In other words, the interiors of the drawing 2*a* and the drawing 2*b* are divided into three regions, and, when the battery remaining amount is 0%, none of these regions is displayed in added color. And, when the battery remaining amount is greater than 0% and is less than 30%, only the first region on the right side is displayed in added color. Moreover, when the battery remaining amount is greater than or equal to 30% and is less than 70%, the first region on the right side and the center region are displayed in added color. And, when the battery remaining amount is greater than or equal to 70%, all of the regions are displayed in added color.

If the batteries that are used are size AA batteries or the like, then, if there is no function on the battery side for outputting battery information to the control device 104, then it is not possible for the battery information acquisition unit 104*a* to acquire the total capacity of the battery and its remaining amount from the battery side. For example, the battery information acquisition unit 104*a* may decide upon the battery remaining amount based upon the value of the voltage that is outputted from the battery. Since, in this type of case, it is difficult to detect the exact battery remaining amount, accordingly it would be acceptable to display the battery remaining amount in two to around ten stages. An example of the case of display in four stages is shown in FIG. 3C.

It would also be acceptable to arrange for the battery information display unit 104*b* to vary the display method for the battery remaining amount according to the type of battery that is in use: for example, if the battery that is being used is a lithium ion battery, then it may be arranged to display the battery remaining amount by a bar graph, and, if the battery that is being used is a size AA battery, then it may be arranged to display the battery remaining amount in four stages. By doing this, it is arranged for it to be possible to display the battery remaining amount by the display method that is most appropriate for that type of battery. As the method for identifying the type of battery, the method shown in the variant embodiment (1) above may be employed.

(4) In the embodiment described above, an example was explained in which two batteries can be used for power supply for the camera 100, i.e. the battery unit 107*a* that is inserted into the battery box 107 and the battery pack 108*a* that is connected to the battery pack connection unit 108. However, the present invention can also be applied to a camera for which three or more batteries can be used. If the number of batteries that can be used is three or greater, then the battery information display unit 104*b'* may display upon the monitor 106 drawings (equivalent to the drawings 2*a* and 2*b*) corresponding to the various batteries and thus corresponding in number to the number of batteries, and may display their respective battery remaining amounts as bar graphs.

(5) In the embodiment described above, an example was explained in which, in the camera 100, information related to a plurality of batteries that can be used is displayed upon the monitor 107. However, the present invention could also be applied to any other electronic device to which a plurality of batteries can be fitted, and to which a monitor that serves as a display device is also fitted. For example, the present invention may also be applied to a notebook personal computer that is driven by a battery, or to a video camera.

The above described embodiments are examples, and various modifications can be made without departing from the scope of the invention.

What is claimed is:

1. A camera, comprising:
an electrical-power-supply-source detection unit that detects, among a plurality of batteries, from which battery supply of electrical power is being received;
a battery capacity detection unit that detects a remaining amount in each of the plurality of batteries; and
a display control unit that displays, upon a display device, a result of detection by the electrical-power-supply-source detection unit and a result of detection by the battery capacity detection unit, wherein,
the display control unit displays the remaining amount in each of the plurality of batteries using at least one of drawings and numerical values and performs display so that areas of regions that respectively correspond to the plurality of batteries indicate a difference in total capacity among the plurality of batteries.

2. A camera according to claim 1, wherein the display control unit displays, upon the display device, remaining amounts for all of the plurality of batteries that have been detected by the battery capacity detection unit.

3. A camera according to claim 2, wherein:
the battery capacity detection unit further detects total capacity of each of the plurality of batteries; and
if battery remaining amount is being shown by drawings, the display control unit displays a plurality of regions corresponding respectively to the plurality of batteries, and, with entire range of one region being taken as being total capacity of one battery that corresponds to that region, shows a proportion of the battery remaining amount of that battery with respect to its total capacity by adding color to a range that corresponds to the battery remaining amount within that region.

4. A camera according to claim 1, wherein the display control unit shows from which one of the plurality of batteries, among the plurality of batteries, supply of electrical power is being received by changing display format of at least one of a region that corresponds to a battery from which electrical power is being supplied, and a numerical value that specifies a remaining amount of the battery from which electrical power is being supplied.

5. A camera according to claim 1, wherein the display control unit performs display so that an area of each region that corresponds to one of the plurality of batteries becomes an area that is proportional to total capacity of that one of the plurality of batteries.

6. A camera according to claim 5, wherein the display control unit makes a contrast between a color applied within a region that corresponds to a battery from which electrical power is not being supplied and a color outside that region, lower than a contrast between a color applied within a region that corresponds to a battery from which electrical power is being supplied and a color outside that region.

7. A camera according to claim 5, wherein the display control unit displays a region that corresponds to the battery from which electrical power is being supplied as blinking.

8. A camera according to claim 5, wherein the display control unit displays a region that corresponds to a battery from which electrical power is being supplied along with a numerical value that specifies a remaining amount of the battery from which electrical power is being supplied, and displays a region that corresponds to a battery from which electrical power is not being supplied by itself.

9. A camera according to claim 1, further comprising a battery type detection unit that detects a type of each of the plurality of batteries, wherein:
   the display control unit changes a display format for a result of detection by the battery capacity detection unit, based upon a result of detection by the battery type detection unit.

10. An electronic device, comprising:
   an electrical-power-supply-source detection unit that detects, among a plurality of batteries, from which battery supply of electrical power is being received;
   a battery capacity detection unit that detects a remaining amount in each of the plurality of batteries; and
   a display control unit that displays, upon a display device, a result of detection by the electrical-power-supply-source detection unit and a result of detection by the battery capacity detection unit, wherein,
   the display control unit displays the remaining amount in each of the plurality of batteries using at least one of drawings and numerical values and performs display so that areas of regions that respectively correspond to the plurality of batteries indicate a difference in total capacity among the plurality of batteries.

* * * * *